United States Patent [19]

Anderson, Jr. et al.

[11] 4,456,675
[45] Jun. 26, 1984

[54] DRY PROCESS FOR FORMING METAL PATTERNS WHEREIN METAL IS DEPOSITED ON A DEPOLYMERIZABLE POLYMER AND SELECTIVELY REMOVED

[75] Inventors: Herbert R. Anderson, Jr., Patterson; Constance J. Araps, Wappingers Falls; Catherine A. Lotsko, Beacon, all of N.Y.

[73] Assignee: International Business Machines Corporation, Armonk, N.Y.

[21] Appl. No.: 517,307

[22] Filed: Jul. 26, 1983

[51] Int. Cl.$^3$ ............................................... B05D 3/02
[52] U.S. Cl. ................................... 430/256; 427/43.1; 427/264; 427/270; 427/271; 430/330
[58] Field of Search .................... 427/43.1, 54.1, 264, 427/270, 271; 430/329, 330, 331, 256, 258, 262, 263

[56] References Cited

U.S. PATENT DOCUMENTS 3,574,657  4/1971  Burnett ................................. 427/271
4,296,146 10/1981  Penn ..................................... 427/270
4,307,176 12/1981  Mochiji ................................ 430/330

OTHER PUBLICATIONS

Anderson et al., *IBM Tech. Disc. Bull.*, vol 22, #2, Jul. 1979, p. 541, 542.
Krevelen et al., "Properties of Polymers", pp. 459–466, Elsevier Scientific Publishing Co., New York, 1976.

*Primary Examiner*—John H. Newsome
*Attorney, Agent, or Firm*—Sughrue, Mion, Zinn, Macpeak and Seas

[57] ABSTRACT

A process for forming a desired metal pattern on a substrate which comprises, forming a mask of a thermally depolymerizable polymer on the substrate with a pattern of openings complementary to the desired metal pattern, blanket coating the substrate and the mask with a metal, heating the substrate to depolymerize the depolymerizable polymer, cooling the surface of the metal to thereby delaminate the metal coated in areas where thermally depolymerizable polymer is present, removing the delaminated metal where necessary, and optionally plasma ashing the depolymerized polymer, if residue thereof remains, to remove the same from said substrate.

6 Claims, 1 Drawing Figure

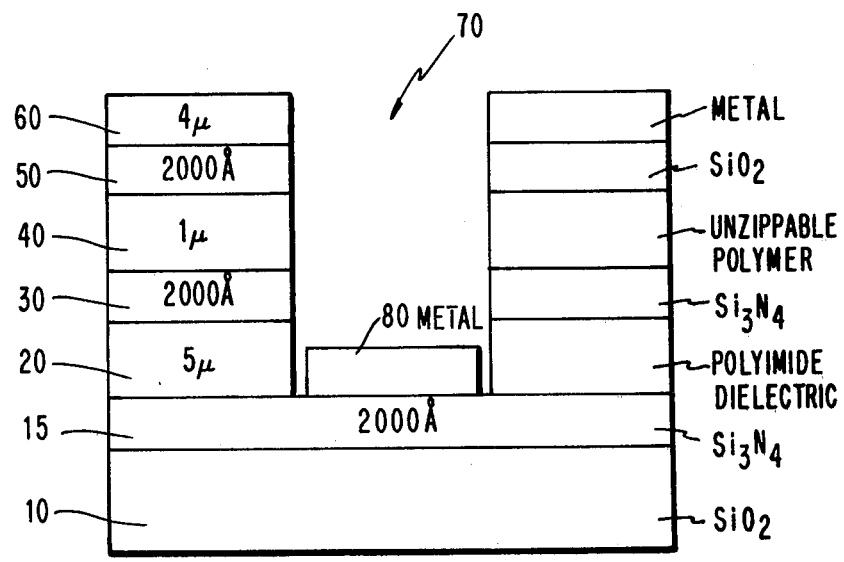

4,456,675

DRY PROCESS FOR FORMING METAL PATTERNS WHEREIN METAL IS DEPOSITED ON A DEPOLYMERIZABLE POLYMER AND SELECTIVELY REMOVED

BACKGROUND OF THE INVENTION

1. Field of the Invention

The present invention relates to a dry process for forming metal patterns on a surface where a depolymerizable polymer is used as a lift-off or release layer for a blanket metallization layer.

In a preferred embodiment, the depolymerizable polymer is blanket coated onto the surface, a reactive ion etching (RIE) etch stop barrier is formed on the depolymerizable polymer and patterns created through the polymer and etch stop barrier using a combination of lithographic and RIE techniques. Blanket metal is vapor deposited onto the surface thereby filling in the etched pattern. After metal deposition, the sample is heated to depolymerize the polymeric release layer, thereby destroying the adhesion of the blanket metal-etch stop barrier-polymer laminate to the surface. Upon cooling, the metal-RIE etch barrier-polymer laminate is readily removed leaving behind the well-adhered metal pattern deposited through the pattern.

2. Description of the Prior Art

IBM Technical Disclosure Bulletins Vol. 22, No. 2, July 1979, pages 541 and 542 disclosure, respectively, the use of gamma radiation treatment to enhance the unzipping of poly-α-methylstyrene and the use of poly-α-methylstyrene and polymethylmethacrylate as unzippable polymers for green sheets.

IBM Technical Disclosure Vol. 15, No. 1, June 1972, page 174, discloses inter alia, polymethylmethacrylate electron beam resists where heating is used to bring out the image rather than developing in a solvent.

U.S. Pat. No. 3,985,597 Zielinski discloses a wet lift-off system based upon the use of a solvent where polysulfone is essentially dissolved out in N-methyl pyrrolidone.

U.S. Pat. No. 4,004,044 Franco et al discloses a wet method for forming patterned films utilizing a transparent lift-off mask where a photoresist layer is removed in a solvent such as N-methyl pyrrolidone.

U.S. Pat. No. 4,181,755 Liu et al discloses a wet method for generating thin film patterns by an inverse lift-off technique which involves soaking in an appropriate photoresist solvent.

U.S. Pat. No. 4,224,361 Romankiw discloses a high temperature lift-off technique.

U.S. Pat. No. 4,272,561 Rothman et al discloses a solvent-based wet lift-off technique used in the fabrication of integrated circuits.

U.S. Pat. No. 4,328,263 Kurahasi et al discloses a process for manufacturing semiconductor devices where a solvent-based wet lift-off technique is used.

The process of the present invention finds application in any of the above processes where a metallization layer is removed except, of course, no solvent lift-off technique is involved in the present invention.

The present invention avoids the disadvantages of currently used wet procedures which involve solvent exposure to remove organic masking layers which can lead to device solvent contamination and adhesion loss with polymer containing devices and structures.

For example, per the prior art wet procedures if a lift-off layer comprises a polysulfone, the same is typically removed by soaking in hot N-methyl pyrrolidone (NMP) for 8–18 hours at elevated temperatures, e.g., 85°–130° C. The solvent dissolves the polymeric polysulfone layer and removes the overlying metal film, leaving behind the desired metallization pattern, e.g., metal vias. Certain devices employ organic insulators in the structure such as a polyimide in place of the inorganic insulators. Problems encountered with this particular system using polysulfone as a lift-off layer include: (1) long soak times in hot NMP; (2) moderately polar, strong solvents such as NMP readily swell organic polymers such as polyimides, the resulting volume increase stressing and cracking barrier layers such as $Si_3N_4$; (3) polymers such as polyimides readily absorb NMP even at room temperature, which are then extremely difficult to remove from the device; and (4) polysulfone is sensitive to electron beam radiation which apparently leads to cross-linking, resulting in reduced solubility and requiring longer NMP soak times to effect lift-off.

Polysulfones are also moisture sensitive, and their characteristics change with humidity, a problem not encountered with the depolymerizable polymers of the present invention.

SUMMARY OF THE INVENTION

The present invention provides a novel process for forming metal patterns on a surface by a completely dry process.

Per the present invention, it has been found that a mask of an organic polymer which is depolymerizable (unzippable) upon heating can be applied to a desired surface, patterned so as to remove the organic polymer in the desired pattern areas (or vias) and a blanket metallization layer can be applied thereon. Upon heating the surface to depolymerize the polymer, the adhesion of the blanket metal-polymer laminate to the surface is altered. Upon cooling the surface metallized layer, it cools at a more rapid rate than the hot sub-layers thereunder, thereby causing rapid contraction of the metal film. Adhesion of the blanket metal film is altered as a result of heating and depolymerization so that contraction forces generated therein upon cooling delaminate the metal film entirely, whereupon film stress causes the film to roll up and pop off or be easily removed by a burst of compressed air. The depolymerized polymer can then be removed by conventional techniques, e.g., plasma ashing, to permit the metal to remain in desired areas, e.g., at plated via holes.

In a highly preferred form of the present invention vias are formed by etching by RIE and, in this embodiment of the invention, it is most preferred that a RIE etch stop barrier be formed between the depolymerizable polymer and the blanket metallization layer, the RIE etch stop barrier being selectively removed with the blanket metallization layer and depolymerizable polymer during "lift-off".

One object of the present invention is to provide for the selective removal of metal from a surface without the need for the use of an organic solvent.

BRIEF DESCRIPTION OF THE DRAWING

The FIGURE is a cross-sectional schematic view of a typical intermediate of a device formed using the process of the present invention just prior to blanket metallization lift-off. It is not to scale.

DESCRIPTION OF PREFERRED EMBODIMENTS

The major object of the present invention is to permit selective removal of a blanket metallization layer leaving behind metallized areas, e.g., metallized vias, utilizing a sacrificial lift-off layer of a depolymerizable or unzippable polymer.

While not wishing to be bound by theory, in accordance with the present invention it is believed that the difference in coefficient of thermal expansion between the blanket metallization layer and underlying organic and inorganic layers permits, with differences in cooling rates, a blanket metallization layer to be selectively removed upon depolymerization (unzipping) of a polymer undercoat per the present invention. Typically, though not mandatorily, there is generally at least a two-fold difference in coefficient of thermal expansion between the blanket metallization layer and layers thereunder.

While not to be construed as limitative, the present invention is explained below with reference to a simplified assembly which comprises an inorganic substrate or the like. Overcoated thereon, for purposes of illustration, is a depolymerizable (unzippable) polymer such as high molecular weight polymethylmethacrylate of poly-α-methylstyrene.

Since, as earlier indicated, preferably conventional RIE techniques are used to form the vias per the present invention, it is most preferred that a RIE etch stop barrier be introduced between the layer of depolymerizable polymer and blanket metallization. While it should be understood that where RIE is not used the RIE etch stop barrier is optional, since this is a highly preferred form of the present invention the following discussion will often be in terms of such a RIE etch stop barrier. Of course, other high energy techniques such as plasma etching, etc., can be used.

The depolymerizable (unzippable) polymer is typically applied to a surface (typically an inorganic insulating layer, though the same could be a conductive layer or an insulating organic layer) in the form of an organic solution and the solvent evaporated off to yield a dry layer of the depolymerizable (unzippable) polymer. A preformed film of the polymer can also be adhered to the layer thereunder, if desired. In the preferred embodiment of the present invention, the RIE etch stop barrier is then formed on the depolymerizable polymer layer, and the resulting assembly is overlaid with a conventional photoresist which is exposed through a mask, typically with UV radiation, in a conventional manner to create a pattern. Other techniques such as electron beam writing, X-ray sensitive resists, etc., can be used with equal success. The pattern is chemically etched through the photoresist to the RIE etch stop barrier layer, where present (typically $SiO_2$), and then transferred through the lift-off layer(s) to layers thereunder as desired by a conventional reactive ion etching technique. Thus, when the blanket metallization layer is applied, it will simultaneously be deposited in the via hole, typically on an inorganic passivating layer, though this is not mandatory, and will also be deposited on the depolymerizable polymer layer or, if present, the RIE etch stop layer.

It being understood that per the present invention in a preferred embodiment an RIE etch stop barrier is formed under the blanket metallization layer and over the depolymerizable polymer layer, the following simplified discussion is offered where the RIE etch stop barrier is not discussed in all instances in detail except for a discussion of representative RIE etch stop barriers and the working example. It should be understood, however, that following depolymerization and the rapid cooling of the blanket metallization layer, both the blanket metallization layer and the RIE etch stop barrier literally spring from the depolymerized polymer layer in a manner as explained for the blanket metallization layer per se.

Typically, though not mandatorily, an additional RIE etch stop barrier layer will be present under the depolymerizable layer. This is preferred because when the depolymerizable polymer layer is removed, one is left with an insulating layer, typically of a material such as $SiO_2$ or $Si_3N_4$. Thus, if it is desired to provide additional layers, there is still a RIE etch stop layer which can be used to prevent RIE etching of layers thereunder.

Following formation of the depolymerizable polymer in the desired masking pattern, i.e., depolymerizable polymer is not permitted to remain in areas where metallization is to remain, a blanket metallization layer is applied thereover or over the optimal RIE etch stop barrier layer.

Upon supplying heat to the surface which carries the depolymerizable polymer, the depolymerizable polymer depolymerizes. Thereafter, the surface blanket metallization layer is cooled more rapidly than layers thereunder due to more rapid surface cooling and continued heat transfer from a heat source, e.g., a heavy quartz sled, upon which the structure sits. This effect can be amplified by blowing nitrogen or compressed air over the surface of the structure. This effectively results in a complete loss of adhesion between the blanket metallization layer and the polymer, permitting the metal to curl up due to residual tensile stress.

The delaminated blanket metallization layer in all areas where depolymerizable polymer has been depolymerized literally curls up and springs from the depolymerized polymer or can be blown off, leaving blanket metallization selectively in those areas where depolymerized polymer was not present, e.g., at metallized vias, where excellent metal adhesion is obtained.

Following the above procedure, residual organic material, i.e., any remaining depolymerizable polymer, can be removed by a conventional technique such as oxygen plasma etching without the necessity for solvent exposure.

Various parameters of the present invention are now explored in more detail.

GENERAL INTRODUCTION

As will be apparent to one skilled in the art, there is a general relationship between the coefficients of expansion of the blanket metallization layer, the ability of the depolymerizable polymer to depolymerize or unzip, the nature of the blanket metallization layer, the nature of the layer(s) under the depolymerizable polymer and the simultaneous heating of the layers under the blanket metallization layer and the cooling of the blanket metallization pattern to cause what can be viewed as a rapid contraction of the blanket metallization layer which, in combination with the depolymerization of the polymer layer, results in a rapid and accurate selective removal of the blanket metallization layer in all areas where depolymerizable polymer is present. Primarily, however, it is believed to be the selective cooling of the metal surface relative to the sub-layers thereunder, which cool much more slowly, which results in the delamination. There is a high degree of stress in the metal film which assists this process since it causes the metal to curl up, an effect which would also promote delamination.

These various factors are obviously often a matter of degree, i.e., variations in heating and cooling rates will depend to a large extent upon the exact blanket metallization layer, the exact depolymerizable polymer and the exact layers thereunder selected. However, upon consideration of the following discussion, one skilled in the art will easily be able to select optimum materials and conditions for any particular system at issue.

THE SURFACE OR SUBSTRATE

The surface to which the depolymerizable polymer is applied means any layer(s) beneath the depolymerizable polymer which permits initial adhesion thereto but which permits depolymerization due to heat transfer thereto and which will retain heat, either inherently or through independent heat supply, to maintain a sufficient temperature differential between the blanket metallization layer and layers thereunder to permit the blanket metallization layer to delaminate upon selective cooling of the blanket metallization layer while sub-layers thereunder are in a heated condition.

Hereafter, this surface is often referred to as a substrate; when the term "SC substrate" is used, this refers to an inorganic substrate as is used in the semiconductor arts which, while the same may be a substrate per the present invention, is more typically merely one component thereof.

The substrate per the present invention typically comprises an SC substrate as is used in semiconductor manufacture. Such SC substrates typically show a coefficient of thermal expansion on the order of $\sim 10 \times 10^{-6}/°C$. or less. While not limitative in any fashion, typical commercially used SC substrates for the manufacture of semiconductive devices include silicon, silicon nitride, ceramics such as $Al_2O_3$, glass-ceramics, etc., and the like.

As will be appreciated by one skilled in the art, in the context of the present invention the term substrate includes a layer or layers which, in fact, is/are formed on an underlying substrate per se, e.g., a layer such as silicon dioxide, silicon nitride and the like. It is well known that such materials serve a passivating function in semiconductor devices.

The major characteristic which a substrate in the present invention must exhibit is that it must permit sufficient thermal transfer in preferred embodiments, upon heating, to permit the thermally depolymerizable polymer to depolymerize, leading to the unzipping effect of the present invention.

The present invention not only finds application where the thermally depolymerizable layer is applied to an inorganic substrate but also finds application in the situation where the thermally depolymerizable polymer is applied to an organic polymer substrate such as a polyimide used for passivating or dielectric effects in a semiconductor device. Other useful organic polymers include other high temperature stable organic materials with low dielectric constants ($<3.6$) such as polyquinoxalines, polyamides, etc. Other processing parameters are the same. Of course, any heating conditions should not degrade such an organic polymer and the polymer should be sufficiently thermally stable so as not to decompose and/or outgas during deposition of the RIE etch step barrier layer or during deposition of the blanket metal layer.

In addition, of course, it would be possible to use organometallic materials under the depolymerizable polymer layer which would be converted during processing to an inorganic material.

THE DEPOLYMERIZABLE POLYMER

The depolymerizable polymer per the present invention is not unduly limited and, in effect, can be freely selected from any polymeric material which will depolymerize at the heating conditions involved to strip cleanly from the substrate without leaving a residue which necessitates solvent removal, and which will assist in selectively lifting the blanket metallization pattern from areas where the depolymerized polymer is present.

In the context of the present invention there is a difference between depolymerizable polymers in general and unzippable polymers, as many polymers will at least partially depolymerize but not all will unzip.

At elevated temperatures, most polymers undergo a series of reactions, e.g., their molecular weight is raised or their molecular weight is lowered.

Per the present invention, a depolymerizable polymer is at least partially depolymerized, i.e., its molecular weight is lowered to a degree sufficient that the overlying blanket metallization layer and, if present, the RIE etch stop barrier, will curl up thereon and literally pop off, albeit there may be some organic residue which can be removed in an oxygen plasma. The depolymerizable polymer which is at least partially depolymerized is mechanically weakened; some at least partially depolymerized polymer may remain and some may be removed with the blanket metallization layer or with the RIE etch stop barrier layer where present, due to the lowering in molecular weight which mechanically weakens the depolymerizable polymer. So long as this "lift-off" effect is achieved, the exact degree of partial depolymerization is not important since if depolymerizable polymer remains, it can be removed by plasma ashing.

In distinction to a depolymerizable polymer, which need be only at least partially depolymerized but which may require plasma ashing to remove residues, an unzippable polymer per the present invention, which is preferred, essentially undergoes a complete reverse of polymerization, regenerating the gaseous monomer or monomers from which the unzippable polymer was formed. This is essentially a residue free process which does not mandatorily require plasma ashing, thought plasma ashing may be desirable to insure a substantially perfectly clean area free from other contaminants. It is important that monomer or monomers generated from the unzippable polymer not undergo secondary reactions, e.g., that an intermediate radical not react or graft to another radical resulting from the unzipping since this would probably require plasma ashing and be the equivalent of a simple depolymerizable polymer. Thus, an unzippable polymer should not yield any residue of substance following unzipping.

Useful depolymerizable polymers are disclosed in related copending application U.S. Ser. No. 417,966 entitled Solder and Braze and Process For Using the Same filed Sept. 14, 1982 in the names of Anderson et al.

The most preferred unzippable polymers illustrate the following physical characteristics:

(1) The polymers should thermally unzip by regular scission of the main chain, resulting in reversal of the polymerization process and regeneration of gaseous monomer(s);
(2) Thermal unzipping should not produce a residue;
(3) The polymer should not unzip and generate volatiles below certain thershold temperature as discussed below.

Usually the depolymerizable or unzippable polymer is selected so that depolymerization or unzipping is initiated at a temperature at least 50° C. greater than the temperature at which the RIE etch stop barrier layer (in the preferred embodiment) or the blanket metallization layer is deposited. This temperature range provides a sufficient safety factor so that any imprecision in the temperatures of high temperature deposition steps should be accounted for.

It should thus be understood, in the context of the present invention, that when the term "depolymerizable polymer" is used, this is meant to imply, whether or not such is stated, that the subclass of "unzippable polymers" is preferred and that where an "unzippable polymer" is referred to herein a "depolymerizable polymer" can be used with equal success except for requiring plasma ashing or a similar dry removal technique.

Such polymers generally fall within a class having the following regular structure:

$$-(-CH_2-\underset{Y}{\overset{X}{C}}-)_n-$$

X = CH₃, CN, CF₃ tert-butyl, etc.

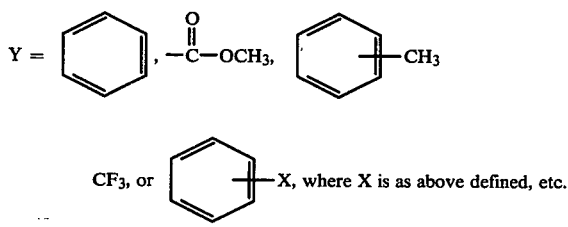

X and Y represent any substituent that:
(1) Is itself thermally stable and cannot be cleaved from the polymer backbone upon heating;
(2) Serves as a stabilizing group to vinyl groups so that the depolymerized unit below is stabilized, but is not so stabilizing as to prevent initial polymerization

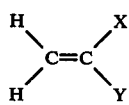

and n is selected so as to most preferably provide a molecular weight as later discussed.

Currently preferred depolymerizable polymers include polymethylmethacrylate and poly-α-methylstyrene.

The molecular weight of the thermally depolymerizable polymers of the present invention is not unduly limited, but typically is on the order of about 2,000 to about 100,000, more preferably from about 15,000 or about 20,000 to about 50,000 determined by the GPC (gel permeation chromatography) method. Molecular weights are not unduly limited since the primary criterion which the thermally depolymerizable polymer exhibits is, of course, the ability to depolymerize cleanly so that at areas where the blanket metallization layer or RIE etch stop barrier layer is to selectively remain there is a clean line of demarcation between the remaining metallization layer and areas where the blanket metallization layer is removed by the joint effect of polymer depolymerization and cooling stress effects generated in the blanket metallization. As one skilled in the art will appreciate, at lower molecular weights typically depolymerization (or unzipping) will require lower temperatures. Unless otherwise indicated, all molecular weight herein are weight average molecular weights.

Typically, the thermally depolymerizable polymer is applied in an organic solvent which permits uniform and easy coating of the thermally depolymerizable polymer. Such solvents are not unduly limited.

Typically, hydrocarbon solvents are used such as toluene, xylene and benzyl alcohol which will readily dissolve poly-α-methylstyrene and similar aromatic substituted polymers. Generally a slightly more polar solvent such as benzyl alcohol is required to dissolve poly-methylmethacrylate.

The thermally depolymerizable polymer can be coated at a polymer level in the solvent which permits uniform and efficient coating; as will be appreciated by one skilled in the art, this is not unduly limited, and we have found that, typically, thermally depolymerizable polymer percentages on the order of about 20 to about 60, more preferably from 30 to 50, are easily worked with. Basis is polymer weight based on total solution weight.

If desired, mixtures of thermally depolymerizable polymers and/or mixtures of solvents can be used, though using mixtures of solvents may complicate drying. However, certain advantages can be encountered upon the use of such mixtures such as improved solubilization of polymer mixtures of different polarity. In those instances where potentially one might find adhesion between the depolymerizable polymer and a layer thereunder or thereover insufficient for some processing step, an adhesion promoter can be used.

The depolymerizable polymers per the present invention are also high resolution photoresist materials, typically being exposed to ultraviolet radiation in a conventional manner. They can be applied by spinning from an organic solvent such as, e.g., toluene, diglyme (2-methoxyethylether), etc.

After ultraviolet exposure the imaged areas can be developed out (removed) by simple heating in a conventional manner. In this instance, the use of a photoresist to form the via patterns is not necessary since the depolymerizable polymer per se serves as a photomask.

The Optional, but Preferred, RIE Etch Stop Barrier Layer

The reason that an RIE etch stop barrier layer is highly preferred is that RIE is the preferred etching means used in the present invention.

Organic materials are typically RIE etched using an oxygen atmosphere in a conventional manner. Thus, oxygen RIE etching will remove the photomask in all desired areas. However, the oxygen RIE etch would also remove the depolymerizable polymer if an RIE stop etch barrier were not present.

Accordingly, a conventional RIE etch stop barrier is provided over the depolymerizable polymer layer which will, following selective removal of the photoresist used to form the via hole, protect the depolymerizable polymer thereunder.

The RIE etch stop barrier can be formed of many conventional etch stop barrier materials, for example, $SiO_2$ by a conventional CVD process, $Si_3N_4$ formed by a conventional plasma assisted CVD process, etc. Thicknesses are not limited so long as the etch stop barrier function is exhibited, keeping in mind that this layer itself will be RIE etched in an atmosphere other than oxygen and undue thicknesses are not necessary. Typically thicknesses will be on the order of about 1,000 to about 4,000 Å, more generally on the order of about 2,000 Å.

The Blanket Metallization Layer

Typically, the blanket metalization layer of the present invention is selected from metals as are used to form metallization patterns in the semiconductor manufacturing art. The major "lift-off" effect comes from the fact that the metal can cool so much more rapidly than the layers thereunder because it radiates heat from its exposed surface (metal has excellent heat transfer properties while organics insulate) while the layers thereunder stay hot due to, e.g., gradient heating as a consequence of sitting on a, e.g., hot quartz sled which retains heat well. Accordingly, a large difference in expansion coefficient is not needed to disrupt the already damaged adhesive interface.

Representative of such metals are Al, Al-Cu, Ti-Cu-Al, Cu, etc.

The conditions of depositing the blanket metallization layer are not overly important so long as polymer depolymerization does not occur during the deposition.

Typical processes used for the deposition of the blanket metallization layer include vapor deposition, with typically temperatures no greater than about 300° C. being used, e.g., 160° C. average.

As one skilled in the art will appreciate, since the via hole has been etched down to the desired layer, typically a SC substrate (or any passivating layer thereover) prior to deposition of the blanket metallization layer, the blanket metallization layer will not only deposit on the depolymerizable polymer layer (or RIE etch stop barrier layer where present), but will also be deposited in the via hole on the desired surface, typically a SC substrate or on the passivating layer thereover, if present.

Dimensions

As will be appreciated by one skilled in the art, the exact thickness of the substrate is not overly important and is as is typically used in the art to form semiconductor devices. This most commonly varies from $1\mu$ to $15\mu$, but by no means is this range limitative.

The blanket metallization layer is, again, merely selected to have a thickness as is typically used in the art for metallization layers. Again, this is not limitative, and generally is on the order of 2000 Å to $10\mu$.

The depolymerizable polymer is merely used as a thickness which will ensure continuous coating in those areas where metal lift-off is desired and at a thickness sufficient to prevent penetration of the blanket metallization layer therethrough. This thickness will depend upon the depolymerizable polymer used, and will typically be on the order of $0.6\mu$ to about $15\mu$, more preferably from 2 m to 8 m. These thicknesses are not limitative and greater and lesser thicknesses can be determined with ease by one skilled in the art.

Depolymerization and Metal Lift-Off Conditions

The depolymerization and dry lift-off technique of the present invention involves heating the substrate to induce depolymerization of the polymer layer and subsequent cooling of the blanket metallization layer while the sample continues to sit on a heat source, most conveniently a ¼" thick quartz sled, though this is not limitative and other heat sources can be used, for example, there is no reason why electron beams, microwaves, a laser, etc., could not be used to heat the depolymerizable polymer.

In fact, in those instances where the rapidity of depolymerization can be assisted by irradiation, an appropriate radiation source could be used in combination with an appropriate heating source, for example, where the depolymerizable polymer is depolymerized by electron beams, such could be used in combination with a different conventional heating source.

The substrate and depolymerizable layer can be heated in any desired fashion. It is not harmful to heat the blanket metallization layer or the RIE etch stop barrier layer, when present, at the same time and, in fact, it is preferred that the RIE etch stop barrier layer be heated to assist to increase the temperature differential with the blanket metallization layer upon "lift-off". Typically, heating is in an inert gas atmosphere, such as nitrogen, argon, etc., at a temperature sufficient to depolymerize the depolymerizable polymer.

Usually, heating is at a temperature of from about 280° C. to about 330° C. for a period of time of from about 5 minutes to about 30 minutes. Generally, at higher temperatures shorter times will be used and at lower temperatures lower temperatures will be used. In most instances, heating at from 300° C. to 320° C. for about 10 to 15 minutes will be sufficient.

Depolymerization (unzipping) essentially results in a change in the quality of the adhesion between the depolymerizable (unzippable) polymer and the overlying blanket metallization or the RIE etch stop barrier in the preferred embodiments of the invention.

After heating to the desired temperature and effecting depolymerization of the depolymerizable polymer layer, the device is withdrawn from the heating zone and the blanket metallization layer is rapidly cooled, whereupon the cooling thereof and the heating of the sub-layers thereunder breaks up the polymer and frees the blanket metal film by disrupting adhesion. Delamination and metal film curling occur almost immediately upon removal from the furnace, e.g., within 30 seconds to 5 minutes.

Various cooling means can be used, e.g., the blanket metallization layer can be air cooled, cooled with pressurized fluorocarbons, e.g., Freon, etc.

What is important is that the blanket metallization layer cool more rapidly than the inorganicorganic sub-layers thereunder.

As a consequence of the more rapid contraction of the blanket metallization layer, and in response to the reduction in metal adhesion to the depolymerized polymer layer following the thermal depolymerization, the blanket metallization layer at all areas where depolymerized polymer is present spontaneously delaminates and rolls up due to tensile stress. The delaminated metal essentially "pops" off or, if some slight adherence is encountered, can be blown off.

Any residual depolymerized polymer is then removed in a conventional fashion, e.g., oxygen plasma etching, without the necessity of solvent exposure.

Metallized areas, e.g., metallized vias, are not delaminated due to the absence of unzippable polymer in such areas and good metal adhesion is obtained.

The FIGURE shows a typical device just prior to blanket metallization layer lift-off. As will be appreciated by one skilled in the art, the device is schematic and is conventional except for the depolymerizable polymer of the present invention.

Not shown in the FIGURE is a conventional silicon substrate as would typically be used for device fabrication. Overlying thereover is an $SiO_2$ layer 10 which in turn has a passivating layer of $Si_3N_4$ about 2000 Å thick, formed in a conventional manner. Typically a conventional polyimide dielectric layer 20 is formed having a thickness of about 5 m. A conventional $Si_3N_4$ layer 30 about 2000 Å thick is shown deposited thereon, the same being formed in a conventional manner. A layer of depolymerizable polymer 40 about $1\mu$ thick is shown formed on layer 30. Typically this is formed by casting as earlier explained. RIE etch stop barrier layer 50 is shown formed on depolymerizable polymer layer 30. Typically this is $SiO_2$ formed by CVD in a conventional manner. On top of layer 50 there is shown the remaining portions of the blanket metallization layer indicated by numeral 60. Finally, in via hole 70 there is shown metal 80 which results from the blanket metallization layer deposition.

As one skilled in the art will appreciate, the inorganic layers, i.e., $SiO_2$ layer 50 and $Si_3N_4$ layer 30 have been removed by a conventional $CF_4$ RIE whereas organic layers 40 and 20 have, prior to blanket metallization deposition, been removed with a conventional oxygen RIE.

As one skilled in the art will further appreciate, metal 80 in via 70 is spaced a slight distance from the polyimide dielectric.

If desired, of course, the above structure can be repeated a plurality of times to achieve "lift-off" effects wherever a blanket metallization depolymerizable polymer combination exists.

Having thus generally described the invention, the following working example is offered to illustrate the same. In the following, a structure is described which is merely representative of an actual device, as will be appreciated by one skilled in the art. However, this example does accurately illustrate the essential processing steps of the present invention.

EXAMPLE

The substrate selected was a layered structure as shown in the FIGURE. Unless otherwise indicated, all dimensions are per the FIGURE. It had a total thickness of ~10 microns and a coefficient of thermal expansion of roughly $2 \times 10^{-6}/°C$. primarily attributable to the $Si_3N_4$ layer 15 on the silicon wafer 10 (SC substrate). All layers were formed in a conventional manner.

In order to estimate the difference in coefficient of expansions, the difference between the polymers present and the metal were used. The metal removes the thin $SiO_2$ layer with it when it delaminates. The major thermal coefficients to consider are

| Polymer | vs. | Metal |
|---|---|---|
| Average of | | Aluminum |

-continued

| Polymer | vs. | Metal |
|---|---|---|
| ~40 × $10^{-6}/°C$. | | 22 × $10^{-6}/°C$. |

The inorganic materials expand much less ~2–7×$10^{-6}/°C$.

The depolymerizable polymers selected were polymethylmethacrylate and poly-α-methylstyrene. They had molecular weights of about 82,000 and 20,000, respectively, determined by the GPC method. 25% by weight solutions of the depolymerizable polymers in 2-methoxyethylether and toluene, respectively, were formed (basis: total solution weight) by dissolving the polymer therein at the following conditions: shaking for 16 hours at room temperature.

The solution was spun onto the $Si_3N_4$ layer at ambient temperature and pressure and dried by heating gradually to 260° C. for 1.5 hours to yield a depolymerizable polymer layer having a dry thickness of $2\mu$. The $SiO_2$ RIE etch stop barrier was then found by CVD.

The depolymerizable polymer layer was then exposed through an appropriate mask using standard photoresist technology and removed in all areas except where via holes were desired by conventional reactive ion etching using $CF_4$ and $O_2$ successively.

Following the above, a blanket metallization layer of Al or Al-Cu was formed over the complete surface of the substrate (areas coated and uncoated with depolymerizable polymer) to a thickness of $4\mu$ using a conventional vacuum evaporation. The blanket metallization layer had a coefficient of thermal expansion of $22 \times 10^{-6}/°C$.

The structure is now amenable to the dry lift-off process of the present invention.

The structure was placed in a furnace, in a flowing nitrogen gas atmosphere, and heated on a flat, quartz sled one quarter inch thick at 300° C. for 20 minutes at normal pressure.

After the above heating period, the structure was withdrawn from the furnace still supported on the hot quartz sled.

Immediately upon withdrawal, the blanket metallization layer was cooled by air at 25° C. to provide a temperature difference of about 200° C. (estimated) between the surface blanket metallization layer and underlying organic and inorganic layers. As a consequence, the blanket metallization layer spontaneously delaminated and popped from the surface of the device within 5 to 30 seconds with the $SiO_2$ RIE etch stop barrier layer and some of the depolymerized polymer.

Following the above processing, residual depolymerizable polymer was removed using oxygen plasma etching in a conventional manner leaving the underlying $Si_3N_4$ layer. Trace $SiO_2$, if any, could be removed by a preliminary $CF_4$ reactive ion etch.

Metallized vias were of good quality morphologically and were not delaminated and good metal adhesion was achieved.

While there have been described what are at present considered to be the preferred embodiments of this invention, it will be obvious to those skilled in the art that various changes and modifications may be made therein without departing from the invention, and it is therefore, intended to cover all such changes and modifications as fall within the true spirit and scope of the invention.

We claim:

1. A process for forming a desired metal pattern on a substrate which comprises:
   forming a mask of a thermally depolymerizable polymer on the substrate with a pattern of openings complementary to the desired metal pattern;
   blanket coating the substrate and the mask with a metal;
   heating the substrate to depolymerize the depolymerizable polymer;
   cooling the surface of the metal to thereby delaminate the metal coated in areas where thermally depolymerizable polymer is present;
   removing the delaminated metal where necessary; and
   optionally plasma ashing the depolymerized polymer if residue thereof remains to remove the same from said substrate.

2. The process of claim 1 wherein said depolymerizable polymer is an unzippable polymer which is converted to the corresponding gaseous monomer(s) upon the heating of the substrate, whereby plasma ashing is not necessary to remove residue.

3. The process of claim 1 which further comprises forming a reactive ion etch stop barrier between the depolymerizable polymer layer and the metal, whereupon cooling the surface of the metal to thereby delaminate the metal coated in areas where thermally depolymerizable polymer is present results in delaminating the metal and the reactive ion etch stop barrier.

4. The process of claim 1 wherein a depolymerizable polymer is selected from the group consisting of polymethylmethacrylate and poly-$\alpha$-methylstyrene.

5. The process of claim 1 wherein the molecular weight of the depolymerizable polymer is about 2,000 to about 100,000.

6. The process of claim 1 wherein the molecular weight of the depolymerizable polymer is about 15,000 to about 50,000.

* * * * *